United States Patent
O'Brien et al.

(10) Patent No.: US 6,927,180 B2
(45) Date of Patent: Aug. 9, 2005

(54) REDUCING LINE TO LINE CAPACITANCE USING ORIENTED DIELECTRIC FILMS

(75) Inventors: Kevin O'Brien, Portland, OR (US); David Gracias, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 10/306,066

(22) Filed: Nov. 27, 2002

(65) Prior Publication Data

US 2004/0101994 A1 May 27, 2004

(51) Int. Cl.$^7$ .................................................. H01L 21/31
(52) U.S. Cl. ........................ 438/781; 438/622; 438/623; 438/778; 438/780
(58) Field of Search ................................ 438/618, 622, 438/623, 778, 780, 781, 782, 787–790

(56) References Cited

U.S. PATENT DOCUMENTS 3,686,591 A * 8/1972 Gikow ........................ 333/167
5,693,566 A * 12/1997 Cheung ....................... 438/624
6,376,393 B1 * 4/2002 Newton et al. .............. 438/783

FOREIGN PATENT DOCUMENTS

JP          2002-164714     *  6/2002

* cited by examiner

Primary Examiner—Tuan H. Nguyen
Assistant Examiner—Thanhha Pham
(74) Attorney, Agent, or Firm—Trop, Pruner & Hu, P.C.

(57) ABSTRACT

By exposing dielectrics to a strong electric field, anisotropic characteristics may be introduced into the dielectric. This may result in the dielectric having different dielectric constants in different directions. As integrated circuits scale, importance of line to line capacitance in one plane increases. Thus, in some embodiments, the dielectric constant of the oriented dielectric may be lower in the plane that controls line to line capacitance.

13 Claims, 1 Drawing Sheet

REDUCING LINE TO LINE CAPACITANCE USING ORIENTED DIELECTRIC FILMS

BACKGROUND

This invention relates generally to semiconductor processing and, particularly, to forming interlayer dielectric materials.

Conventional integrated circuits may include an interconnect metal layer which is made up of a large number of metal interconnects. Each of these interconnects may carry signals. Each signal on each interconnect may be affected by line to line capacitance due to adjacent interconnects.

As feature size dramatically decreases, particularly below 1 micron, the contribution to overall capacitance due to line to line capacitance dramatically increases. At the same time, the contribution of layer to layer capacitance dramatically decreases.

Thus, there is a need for better ways to reduce the line to line capacitance of integrated circuits.

DETAILED DESCRIPTION

The line to line capacitance between two metal lines in a particular interconnect metal layer is a function of the dielectric constant of the material between the lines. The material between the lines is an interlayer dielectric or ILD. Generally, ILDs have relatively isotropic dielectric constants. Thus, they neither directionally inhibit nor directionally encourage the generation of capacitance in the horizontal plane of the layer or between layers transverse to the horizontal plane.

However, since the effect of line to line capacitance within a given layer is dramatically more important as feature size decreases, the inventors of the present invention have determined that it may be advantageous to decrease the dielectric constant as seen between metal lines in the same layer. Even if this directionality has the effect of increasing the capacitance because of the adverse dielectric constant created by the same material in the transverse or vertical direction between layers, the reduction of the line to line capacitance has a much greater effect as feature size scales downwardly.

Thus, by generating oriented or anisotropically oriented dielectrics between the metal lines, the dielectric constant, as seen by adjacent metal lines in the same layer, may be substantially decreased, thereby substantially decreasing the line to line capacitance.

In accordance with one embodiment of the present invention, the oriented dielectric material is oriented in a direction transverse to the plane of the metal lines in a particular metal layer. This has the effect of decreasing the dielectric constant as seen by those metal lines. The decreased dielectric constant in turn results in decreased line to line capacitance.

To the extent that the average polarization along the electric field direction is reduced, the capacitance is reduced. In essence, lowering the contribution of the molecular dipole moment by orienting the molecular dipole moment perpendicularly to the field direction can reduce the average polarization all the way to zero in some cases. This reduced molecular dipole moment dramatically reduces the dielectric constant as seen by the adjacent metal lines. In other words, an oriented dielectric, placed between lines, has low polarization in the axis between those lines.

Oriented or anisotropic dielectrics are solids that have anisotropy in polarization, refractive index, or dielectric constant. Suitable materials include organosilicides, polymers, and oxides, to mention a few examples.

Figure 1:
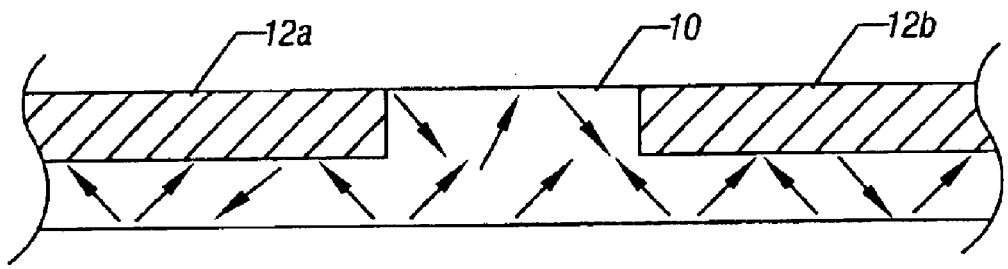
FIG. 1 is an enlarged cross-sectional view of one embodiment of the present invention.

In accordance with one embodiment of the present invention, referring to FIG. 1, the conductive lines 12a and 12b may be separated by a dielectric 10. As shown in FIG. 1, the dielectric 10 exhibits no anisotropy or is essentially isotropic in all directions. If the molecules in the dielectric 10 are oriented vertically, they will tend to be more polarizable in the vertical direction and have low polarizability in the horizontal plane between the lines 12a and 12b.

The dielectric 10 may be a spin-on thin film dielectric in one embodiment. Suitable spin-on dielectric films include polyimides, aromatic polyesters, and polydimethylsiloxanes. These materials are linear and have strong anisotropy with aromatic and polarizable bonds along the direction of the molecule and low polarizability in the direction perpendicular to the chain. These films may be spun-on substrates and oriented at elevated temperatures in strong DC electric fields. In one embodiment, the applied electric field may be greater than 1E5 V/cm.

Figure 2:
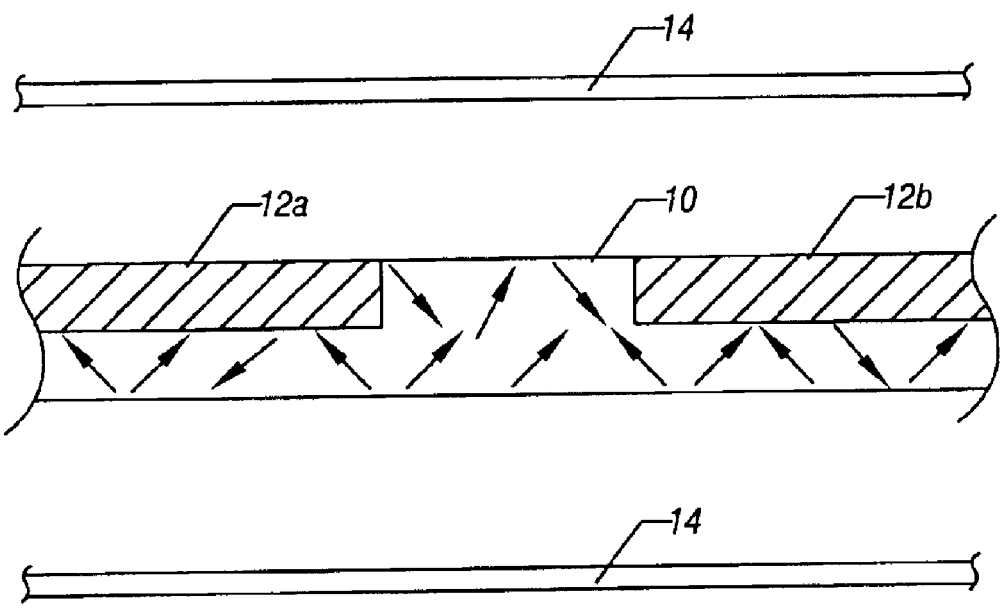
FIG. 2 is an enlarged cross-sectional view of the embodiment shown in FIG. 1 at a subsequent stage in accordance with one embodiment of the present invention.
Figure 3:
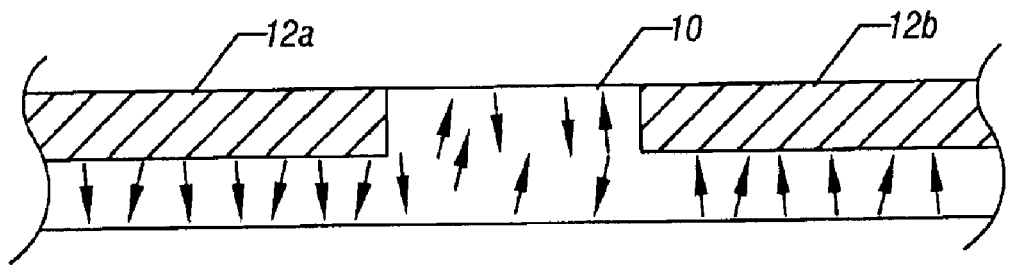
FIG. 3 is an enlarged cross-sectional view of the embodiment shown in FIG. 2 at a subsequent stage in accordance with one embodiment of the present invention.

Thus, referring to FIG. 2, an electric field may be applied by plates 14 in the direction transverse to the horizontal plane in which the dielectric 10 and the lines 12 lie. As a result of the applied electric field, an anisotropy may be developed as indicated in FIG. 3. This anisotropy is in the vertical direction, thereby lowering the dielectric constant in a horizontal direction as seen between the lines 12a and 12b. As a result, the line to line capacitance may be reduced.

In accordance with another embodiment of the present invention, carbon doped oxide (CDO) type dielectrics may be deposited to form the structure shown in FIG. 1. CDO dielectrics may, for example, be between about five and fifty percent carbon, and may have a thickness between about 300 and about 3000 nanometers, in some embodiments. Those dielectrics may be cured at elevated temperatures and strong poled electric fields as suggested in FIG. 2.

If the average orientation of the Si—O—Si bond that dominates the polarization of these materials is increased to be more in the vertical direction as compared to the horizontal direction, an anisotropy is developed. By increasing the anisotropy of the CDO, the effective dielectric constant in the layer to layer capacitance may be compromised while decreasing the dielectric constant effectively in the line to line capacitance direction. The poling can be done by adding a strong DC field at the end of the deposition in the chemical vapor deposition chamber while the film is still cooling.

In accordance with still another embodiment of the present invention, liquid crystal materials may be utilized as interlayer dielectrics. Liquid crystal materials are amenable to spontaneous orientation on the molecular level. Spontaneous electrically poled interlayer dielectrics may be formed of liquid crystal materials in accordance with another embodiment of the present invention.

Thus, in some embodiments of the present invention, deferential dielectric constants may be formed which improve capacitance in one direction even if they adversely affect the capacitance in another direction. Particularly where the direction of improvement is within a given layer, in some embodiments, the line to line capacitance may be dramatically improved.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a pair of conductive lines separated by an isotropic dielectric constant dielectric; and positioning said dielectric within an electric field to change the dielectric constant of the dielectric from isotropic to anisotropic.

2. The method of claim 1 including introducing a vertical anisotropy in said dielectric constant transverse to the plane of said lines.

3. The method of claim 1 including decreasing the dielectric constant between said lines.

4. The method of claim 1 including decreasing the line to line capacitance by orienting the dielectric.

5. The method of claim 1 including increasing the dielectric constant in one direction while decreasing the dielectric constant in another direction.

6. The method of claim 1 including exposing said dielectric to an electric field having a field strength greater than 1E5 V/cm.

7. The method of claim 1 including forming said dielectric by forming a spin-on thin film dielectric on a structure, between said pair of said lines.

8. The method of claim 7 including exposing said spin-on thin film dielectric to an electric field transverse the plane of said lines.

9. The method of claim 1 including forming said dielectric between said lines by depositing a carbon doped oxide dielectric and heating the dielectric while exposed to an electric field.

10. The method of claim 9 including exposing said dielectric to an electric field having a field strength greater than 1E5 V/cm.

11. A method comprising:

forming a pair of conductive lines separated by an isotropic dielectric constant dielectric; and using an applied electric field to change the dielectric constant of said dielectric material so that the dielectric constant is lower in the direction between said lines and higher in a direction transverse thereto.

12. The method of claim 11 including exposing said dielectric to an electric field having a field strength greater than 1E5 V/cm.

13. The method of claim 11 including forming an integrated circuit including at least a metallization layer, said conductive lines being formed in said metallization layer, said dielectric layer being formed in said metallization layer, the dielectric having a lower dielectric constant in the direction parallel to said metallization layer and a higher dielectric constant in the direction orthogonal to said metallization layer.

* * * * *